United States Patent [19]

Davis

[11] 4,267,518
[45] May 12, 1981

[54] GAIN CONTROLLABLE AMPLIFIER STAGE

[75] Inventor: William W. Davis, Rosemount, Minn.

[73] Assignee: Sperry Corporation, New York, N.Y.

[21] Appl. No.: 74,851

[22] Filed: Sep. 13, 1979

[51] Int. Cl.³ .............................................. H03F 3/45
[52] U.S. Cl. ...................................... 330/254; 330/278
[58] Field of Search ................................. 330/254, 278

[56] References Cited

U.S. PATENT DOCUMENTS

| | | | |
|---|---|---|---|
| 3,531,731 | 9/1970 | Matsuura et al. | 330/278 |
| 3,706,937 | 12/1972 | Hanna | 330/254 |
| 4,041,409 | 8/1977 | Kaminami et al. | 330/254 |

*Primary Examiner*—Harold A. Dixon
*Attorney, Agent, or Firm*—Douglas L. Tschida; Kenneth T. Grace; William E. Cleaver

[57] ABSTRACT

A common-emitter amplifier having its dynamic voltage gain controlled by using a controlled emitter-follower to shunt the emitter impedance of the common emitter amplifier.

4 Claims, 8 Drawing Figures

4,267,518

GAIN CONTROLLABLE AMPLIFIER STAGE

BACKGROUND OF THE INVENTION

The present invention is related to gain controlled common-emitter amplifiers and more specifically to a common-emitter amplifier having a controllable dynamic voltage gain. The circuit is particularly adaptable to hybrid circuits and facilitates the fabrication of such circuits without excessive trimming of resistors and/or matching of active components.

Previously designed amplifier circuits have been fabricated using field effect transistors (FET) as the gain controlling components, but the operating characteristics of the FET's vary substantially from lot to lot and even within a graded lot, thereby increasing the difficulty of fabrication of the hybrid devices. Specifically, it was necessary to "hot trim" the resistors associated with each FET to match the circuit gains and operating points, which required additional time and expense.

The present invention, however, simplifies the fabrication of such circuits due to the uniformity of bipolar transistors and the ability to "cold trim" components to fixed design values.

SUMMARY OF THE INVENTION

The present invention is directed to a common-emitter amplifier, wherein the dynamic voltage gain of the amplifier is controlled by AC coupling an adjustable voltage gain control element, such as an emitter-follower, in parallel with the amplifier's emitter impedance to reduce the dynamic emitter impedance and increase the dynamic voltage gain of the amplifier. The circuit operates by AC coupling divided voltage signals from a tapped emitter resistance of the common-emitter amplifier to magnify the small signal response of the emitter-follower and to AC shunt the emitter-follower's output impedance with the tapped emitter resistance to reduce the effective emitter impedance of the common-emitter amplifier, thus increasing the dynamic voltage gain of the common-emitter amplifier by a factor proportionately related to the divided signal.

DESCRIPTION OF THE PREFERRED EMBODIMENT

Figure 1:
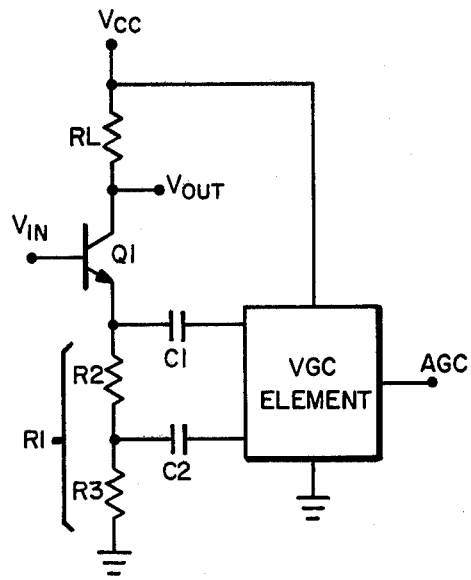
FIG. 1 is a circuit diagram of a common-emitter amplifier having its emitter impedance AC shunted by a dynamic voltage gain control (VGC) element.

Referring to FIG. 1, a generalized embodiment is shown with transistor Q1 configured as a common-emitter amplifier having a collector load resistor RL and a tapped emitter resistor R1 comprised of series resistor portions R2 and R3. The voltage gain, Av, for such an amplifier can be approximated for low frequency, small signal conditions as the negative of the ratio of RL to $Z_E$ (i.e., $Av = -(RL/Z_E)$, where $Z_E$ is the effective emitter impedance). Millman and Holkias, Electronic Devices and Circuits, McGraw Hill, Inc., pp. 340 to 348 (1967). The dynamic voltage gain for the Millman and Holkias' circuit, however, is uncontrolled, since there is no way to either increase the RL or decrease the $Z_E$ of the common-emitter amplifier to small signal variations of the input signal. The present invention, however, controls the dynamic (i.e., small signal) effective impedance $Z_E$ by combining R1 in parallel with a voltage gain control, VGC, element which has an adjustable dynamic output impedance, Z. The dynamic effective impedance $Z_E$, can consequently be adjusted and thus control the dynamic voltage gain Av of the common-emitter amplifier stage.

The VGC element of the present circuit is in turn controlled via an automatic gain control, AGC, voltage, which AGC voltage establishes the quiescent operating point and small signal response characteristic to variations of $V_{in}$ of the VGC element. Small signal variations of $V_{in}$ are tracked by the VGC element by using capacitor C2 to coupled the voltage changes across R3 to the input of the VGC element and C1 to couple the resultant dynamic output impedance, Z, variations in parallel with R1. It is to be noted that the linear range of the small signal response of the VGC element, which affects the dynamic output impedance Z, is magnified by the ratio of the voltage division of $V_{in}$ by R2 and R3 and will be described in more detail later. The dynamic voltage gain of the common-emitter amplifier is thus controlled by adjusting the AGC voltage to establish a dynamic effective impedance $Z_E$ for the common-emitter amplifier.

Figure 2:
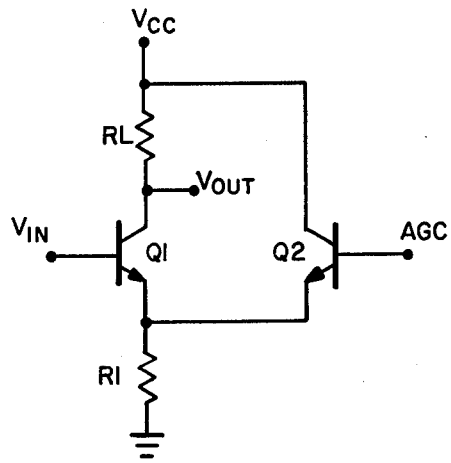
FIG. 2 is a circuit diagram similar to FIG. 1 wherein the VGC element has been substituted with a simple emitter-follower.

Referring to FIG. 2, a simplified version of the improved amplifier of FIG. 1 is shown, where the VGC element is comprised of a transistor Q2 configured as an emitter-follower having its base forward biased via the AGC voltage which establishes Q2's quiescent operating point and small signal response characteristic. In this case, the base to emitter impedance of Q2 is used to shunt R1 during the small signal variations of $V_{in}$. The base-to-emitter small signal response of Q2 to $V_{in}$ is, however, limited by the linearity limitations of Q2's transconductance, Gm. The linearity limitation is, however, not desirable since the typical small signal excursions of $V_{in}$ exceed an approximate 0.026 volt limit which exists at room temperature. It is therefore desirable to magnify the VGC element's small signal response characteristic. The circuit of FIG. 3 meets the larger small signal response requirements and also enables the adjustment of each stage's quiescent operating point by adjusting the AGC voltage connected to resistor R5 and the base current of transistor Q2. It is to be noted that R5 generally consists of a trimmable resistor or voltage divider coupled to a voltage source available to the hybrid package, but it is to be further noted that the present invention is not limited to hybrid devices.

Figure 3:
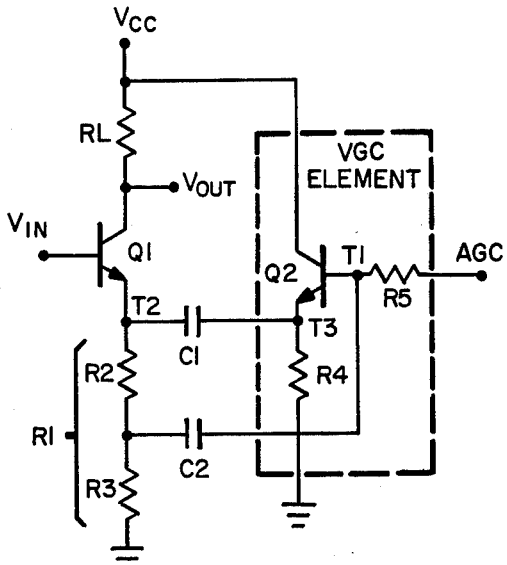
FIG. 3 is a circuit diagram similar to FIG. 2 wherein the R2, R3 voltage divider increases the small signal dynamic range of the common-emitter amplifier.

Referring to FIG. 3, the preferred embodiment is shown wherein the VGC element has been substituted with transistor Q2, again configured as an emitter-follower. The small signal voltage that develops across R3 is coupled via capacitor C2 to terminal T1 and is used to control the small signal response of transistor Q2; and the output impedance Z that develops on the emitter of Q2 is coupled to terminal T2 via capacitor C1. The output impedance Z of the emitter-follower is now the parallel combination of resistor R4 and the effective emitter-to-ground impedance of Q2. The small signal response characteristic to variations of $V_{in}$ (i.e., signal handling ability of Q2), however, is increased by the factor corresponding to the resistance ratio that is established between R2 and R3, since the voltage that develops across R2 and consequently the base-to-emitter junction of Q2 between terminals T1 and T3 is divided down by the factor of R2/(R2+R3). The dynamic range of Q2 to small signal variations of $V_{in}$ is therefore magnified over that of FIG. 2 by the inverse of this factor which is typically established as a value of 10. The small signal output impedance Z of the emitter-follower now becomes $$Z = \frac{R4\ Gm(Q2)}{R4 + Gm(Q2)} \cdot \left[\frac{R2 + R3}{R2}\right]$$

where Gm(Q2) is the transconductance of Q2 and $$Gm(Q2) \simeq qI_E/kT$$

where
 q is the charge on the base-to-emitter electrons
 T is the temperature
 k is Boltzman's constant, and
 $I_E$ is the emitter current.
$I_E$, however, is dependent on the AGC voltage and quiescent operating point, and at room temperature $Gm(Q2) \simeq I_E/26$ mv.

The dynamic voltage gain of the common-emitter amplifier is in turn increased with the small signal shunting of Z and R1. The effective emitter impedance $Z_E$ of Q1 is reduced to a value less than R1 and becomes $$Z_E = \frac{R1\ R4\ Gm(Q2)}{R1 + R4 + Gm(Q2)} \cdot \left[\frac{R2 + R3}{R2}\right]$$

And the reduction of $Z_E$, in turn, increases the small signal voltage gain Av (i.e., $AV = -RL/Z_E$) of the common-emitter amplifier by the inverse of the reduction in $Z_E$.

Figure 4:
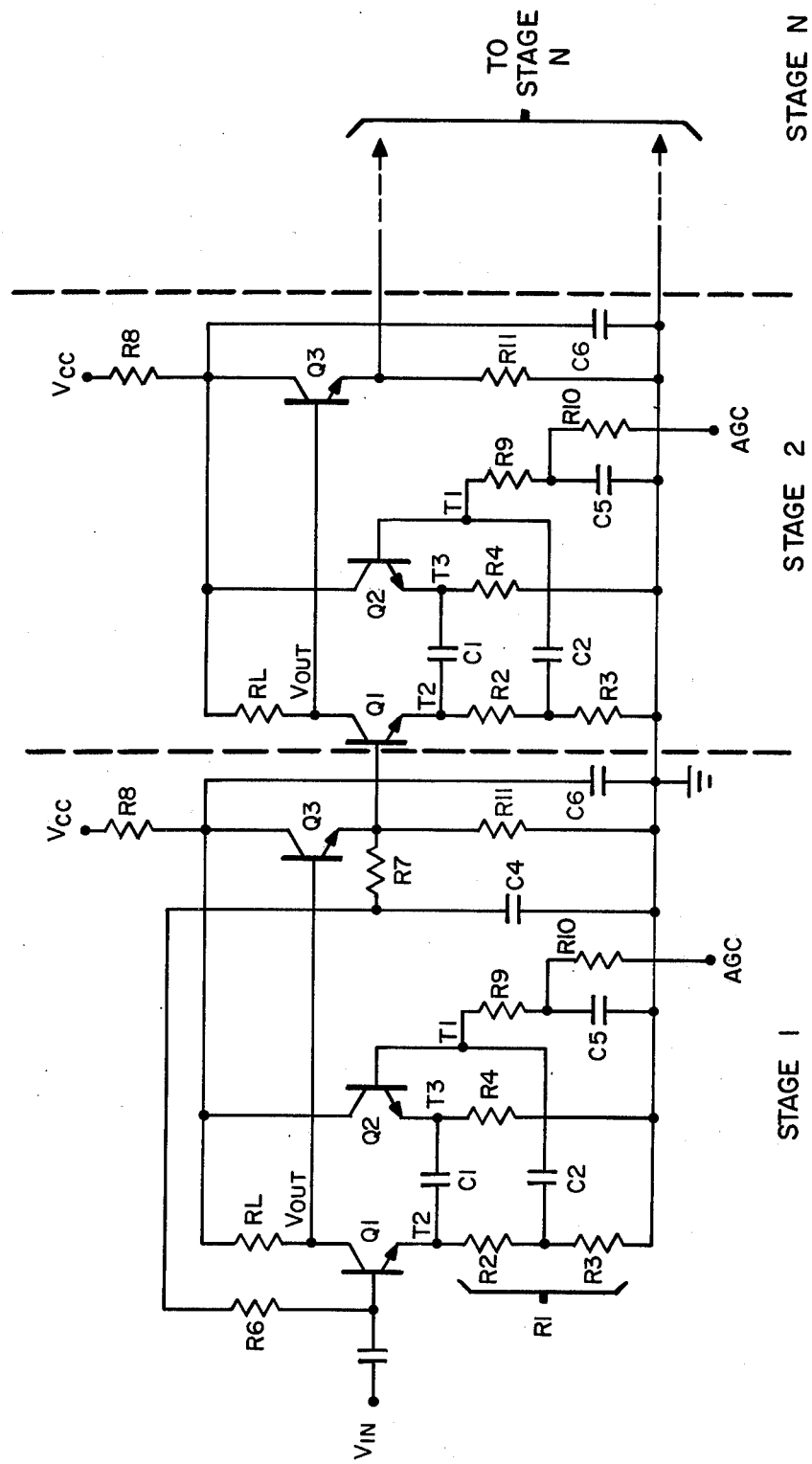
FIG. 4 is a circuit diagram of a cascaded arrangement of the amplifier stage of FIG. 3.

It is to be noted that because the increase in the small signal gain of the common-emitter amplifier is primarily dependent on the AC shunting of R1 and Z, the amplifier stage of FIG. 3 can be DC coupled in a number of arrangements, one of which is shown in the "N" stage cascaded amplifier arrangement of FIG. 4. Each stage of the cascaded amplifier operates in substantially the same manner as previously described. The DC voltage gain of each stage is established at a value of approximately unity, and the quiescent operating point of transistor Q1 of the second stage is established by the bias combination of resistors R6 and R7 and capacitor C4, which combination is not needed in the subsequent stages. It is also to be noted that the $V_{cc}$ voltage source is filtered from high frequency variations by capacitor C6 and is reduced by the voltage drop that develops across resistor R8; and that the bias combination of resistors R9 and R10 and capacitor C5 establish the AGC bias on the base of transistor Q2. The only other difference of substance is that an additional emitter-follower, comprised of transistor Q3 and emitter resistor R11 is also added to each stage to increase the current gain of each stage to overcome the capacitive loading of the next stage. Each additional stage, however, would be configured the same as stage 2.

Figure 5:
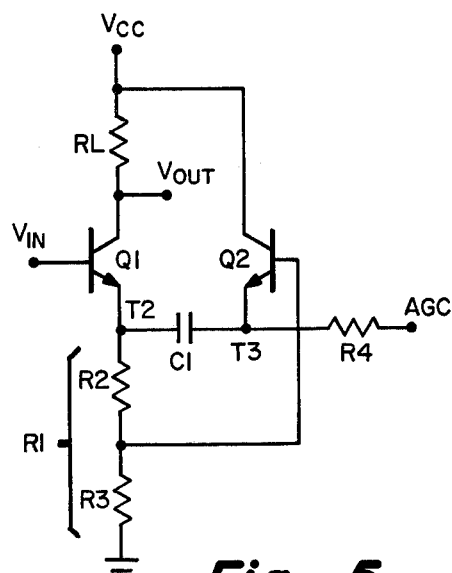
FIG. 5 is a circuit diagram of an alternative embodiment of FIG. 3 wherein the emitter current and the small signal impedance of Q2 is controlled directly by the AGC bias.
Figure 6:
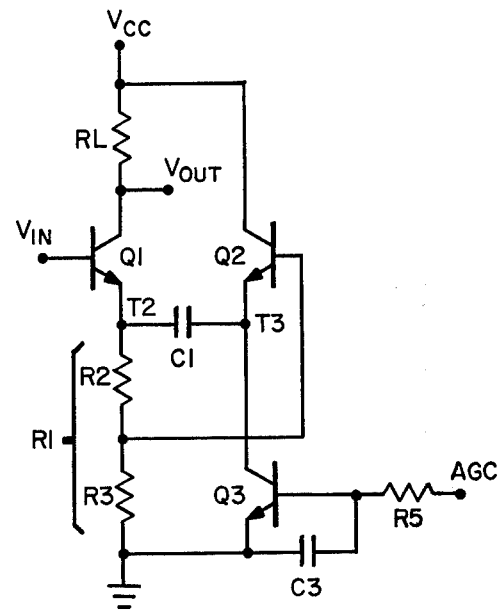
FIG. 6 is a circuit diagram of an alternative embodiment to FIG. 5.

Additional embodiments of the present invention are also shown in FIGS. 5, 6, 7 and 8, and each of these circuits operates essentially in the same manner previously described. Referring to FIGS. 5 and 6, the embodiments shown differ in that the bases of the Q2 transistors are DC coupled to the small signal voltage that develops across resistor R3 and that the AGC voltage is now used to bias the emitter current $I_E$ of transistor Q2.

FIG. 6 differs from FIG. 5 in that it includes an additional common-emitter configured transistor Q3 which operates essentially the same as the AGC source and resistor R4 of FIG. 5. In this case, however, the collector current of transistor Q3 is controlled and used to vary the output impedance Z at T3. The capacitor C3 and the resistor R5 serve to filter out high frequency variation in AGC voltage.

Figure 7:
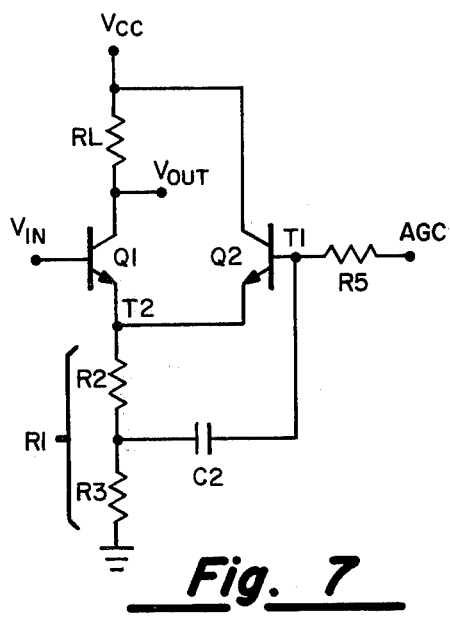
FIG. 7 is a circuit diagram of still another alternative embodiment to FIG. 3, wherein the emitter of transistor Q2 is DC coupled to the emitter of transistor Q1.
Figure 8:
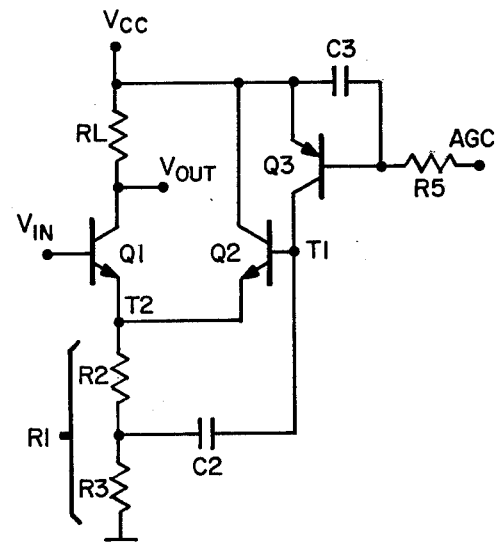
FIG. 8 is a circuit diagram of an alternative embodiment of FIG. 7.

Referring to FIGS. 7 and 8, two additional embodiments are shown where the emitters of the Q2 transistors are DC coupled to the emitters of Q1. The small signal response characteristics of the circuits are, however, limited by the voltage drop across RL. Since the worst case condition, maximum $V_{out}$ at the minimum Av, occurs when the positive peak swing of $V_{out}$ tries to exceed the DC voltage drop across RL which is when most of the DC current from $V_{cc}$ is being bypassed into transistor Q2.

While the present invention has been described with reference to its preferred embodiment and additional alternative embodiments, it is to be recognized that still other embodiments are conceivable to one skilled in the art without departing from the scope of the following claimed invention.

What is claimed is:
1. A gain controlled amplifier, comprising:
 a first transistor having a base, a collector and an emitter and a voltage gain dependent on the ratio of a collector impedance, coupled to said collector, to an emitter impedance, coupled to said emitter, said first transistor receiving input signals impressed on said base and producing output signals on said collector amplified in direct proportion to said voltage gain;
 capacitor means coupled to said emitter for providing a low impedance, small signal current path;
 voltage gain control means coupled to said capacitor means and responsive to small signal variations of said input signals for producing a variable output impedance, comprised of
  a second transistor having a second base, a second collector, and a second emitter, said second base and second emitter coupled to said capacitor means, and
  means for establishing a quiescent impedance for said second transistor, said variable output impedance varying about said quiescent impedance during said small signal variations,
 whereby the effective emitter impedance coupled to said first transistor during said small signal variations depends on the combined impedance of said voltage divider means and said variable output impedance, thus increasing said voltage gain.

2. An amplifier as set forth in claim 1 wherein said emitter impedance is comprised of series connected first and second resistors, respectively connected between said emitter of said first transistor and a first voltage and having an intermediate tap coupled to said capacitor means, said first and second resistors voltage dividing said small signal variations and thereby increasing said amplifier's range of response to small signals by the ratio of the sum of said first and second resistors to said first resistor.

3. An amplifier as set forth in claim 2 wherein said means for establishing said quiescent impedance comprises:
   a third resistor coupled between said second emitter and a second voltage; and
   third voltage means coupled to said base of said second transistor means for establishing said quiescent output impedance by controlling the base current of said second transistor.

4. A gain controlled amplifier, comprising:
   a first transistor having a base, a collector and an emitter and a voltage gain dependent on the ratio of a collector impedance, coupled to said collector, to an effective emitter impedance, coupled to said emitter, said first transistor receiving input signals impressed on said base and producing output signals on said collector amplified in direct proportion to said voltage gain;
   voltage divider means coupled to said emitter and having an intermediate tap for voltage dividing small signal variations of said input signal, thereby increasing said amplifier's range of response to small signals;
   capacitor means coupled to said emitter and said intermediate tap for providing a low impedance, small signal current path;
   voltage gain control means coupled to said capacitor means and responsive to said divided small signal variations for producing a variable output impedance, comprised of
   a second transistor having a second base, a second collector, and a second emitter, said second base and second emitter coupled to said capacitor means, and
   means for establishing a quiescent output impedance for said second transitor, said variable output impedance varying about said quiescent impedance during said small signal variations;
   said effective emitter impedance during said small signal variations thus depending on the combined impedance of said voltage divider means and said variable output impedance and thereby increasing said voltage gain.

* * * * *